United States Patent

Fong

[19]

[11] Patent Number: 5,999,056
[45] Date of Patent: Dec. 7, 1999

[54] VARIABLE GAIN AMPLIFIER USING IMPEDANCE NETWORK

[75] Inventor: Keng Leong Fong, Sunnyvale, Calif.

[73] Assignee: Philips Electronics North Amercia Corporation, New York, N.Y.

[21] Appl. No.: 09/107,523

[22] Filed: Jun. 30, 1998

[51] Int. Cl.⁶ .................................................. H03G 3/10
[52] U.S. Cl. ........................................... 330/278; 330/279
[58] Field of Search .................................. 330/284, 279, 330/278

[56] References Cited

U.S. PATENT DOCUMENTS

| | | | |
|---|---|---|---|
| 4,380,739 | 4/1983 | Velo | 330/254 |
| 4,462,003 | 7/1984 | Takamatsu | 330/254 |
| 4,839,611 | 6/1989 | Kukulinsky | 330/284 |
| 5,233,309 | 8/1993 | Spitalny et al. | 330/84 |

OTHER PUBLICATIONS

C.D. Hull, A Direct–Conversion Receiver for 900 MHZ (ISM Band) Spread–Spectrum Digital Cordless Telephone, 31 IEEE Journal of Solid–State Circuits, No. 12, pp. 1955–1963 (Dec. 1996).

*Primary Examiner*—Robert Pascal
*Assistant Examiner*—Henry Choe
*Attorney, Agent, or Firm*—Brian J. Wieghaus

[57] ABSTRACT

A circuit includes a transconductance device which converts an input signal voltage to a signal current. An output terminal is coupled to receive signal current from the transconductance device. A gain-control circuit has an impedance network coupled to the output terminal to maintain a constant impedance at the output terminal and selectively steers current from the transconductance device through at least first and second different nodes of the impedance network to vary the current supplied to the output terminal. The circuit has reduced noise figure degradation as compared to known current steering circuits by controlling gain without dumping signal current directly to the supply and without changing the impedance at the output terminal. The circuit is particularly useful in the RF section of radio receivers and transmitters, such as in cellular phones.

20 Claims, 3 Drawing Sheets

VARIABLE GAIN AMPLIFIER USING IMPEDANCE NETWORK

BACKGROUND OF THE INVENTION

1. Field of the Invention

The invention relates generally to gain control amplifier circuits and, more particularly, to an improvement which reduces the dependency of the noise figure (NF) on the level of gain control.

2. Description of the Prior Art

Variable-gain amplifiers ("VGA's") are used in numerous electronic products such as global positioning (GPS) receivers, wireless local area networks and mobile communication devices, such as cordless and cellular phones. In particular, VGA's are used in various parts of such devices, for example, in the radio frequency (RF), intermediate frequency (IF) and the low frequency or baseband circuits, of these devices.

Traditionally, the gain of a RF VGA has been controlled 20 in discrete steps by using a current-steering (or current splitting) techniques. A typical current-steering VGA 100 is illustrated in FIG. 1. This circuit is known from the Journal: C. D. Hull, *A Direct-Conversion Receiver for 900 MHZ (ISM Band) Spread-Spectrum Digital Cordless Telephone,* 31 IEEE Journal of Solid-State Circuits, no. 12, pp. 1955–1963 (December 1996). Transistors Q1, Q2 and Q3 form a common-emitter transconductance stage 110 which converts radio-frequency RF input power $RF_{in}$ into current. The transconductance stage is typically, but not always, degenerated by impedance Ze to improve its linearity. In a high-gain mode of the VGA 100, the voltages at nodes B1 and B2 are set low to turn off the transistors Q6 and Q8. In this mode of operation, the transistors Q4, Q5 and Q7 function as cascode transistors of the transconductance stage. The resistor R1 functions as an output matching resistor. The inductor L1 and the capacitor C1 form an impedance-transformation network to transform the resistance of the resistor R1 to match that of an external load resistor (not shown in FIG. 1). The inductor L1 also serves as a pull-up inductor to increase the headroom at the collectors of the cascode transistors (Q4, Q5 and Q7).

In a low-gain mode, the transistors Q5 and Q7 are turned off and the voltages at nodes B1 and B2 are set high to render the transistors Q6 and Q8 conductive. This steers current away from the transistors Q5 and Q7 and dumps the output current from the transistors Q2 and Q3 to the power supply. As a result, the gain of the VGA is reduced, because less current is available at the output $RF_{out}$ for a given input signal $RF_{in}$. In a medium-gain mode, the voltage at the node B1 is set low but the voltage at the node B2 is set high. The transistors Q5 and Q8 are conductive, but the transistors Q6 and Q7 are turned off. As a result, the transistors Q1 and Q2 of the transconductance stage supply output currents to node X, but output current from the transistor Q3 is dumped to the power supply.

In the current-steering gain-control scheme of FIG. 1, the gain steps between different gain modes depend on the device size ratios among the transistors Q1, Q2 and Q3. For instance, if the device size ratios Q1:Q2:Q3 are 1:1:2, the gain differs by a factor of 2 between the each successive gain mode, providing a uniform gain step of 6 dB.

A disadvantage of the known VGA shown in FIG. 1 is that it has higher noise figures in the low-gain and medium-gain modes than in the high-gain modes. The noise figure (NF) of a circuit measures the degradation of signal-to-noise ratio (SNR) caused by the circuit. Signal-to-noise ratio is defined as: SNR in decibels=10 log(signal power/noise power). The noise figure is defined as: NF in decibels=(SNR at input in dB)–(SNR at output in dB). Throwing away some of the signal current by dumping to power supply, as in the low and medium gain modes of the LNA of FIG. 1, decreases the signal power, and hence degrades the noise figure by reducing the SNR at the output of the LNA. The current-steering gain-control approach of FIG. 1 simply causes too high of a NF in the low-gain modes to be useful in certain applications.

Accordingly, it is an object of the invention to provide a gain-control amplifier circuit with reduced NF degradation across multiple gain modes.

SUMMARY OF THE INVENTION

Generally speaking, in a circuit according to the invention, a transconductance device includes a main current path and a control terminal which receives an input signal to control a current through the main current path. An output terminal is coupled to the main current path of the transconductance device. A gain-control circuit has an impedance network coupled to the output terminal and selectively couples the main current path of the transconductance device to different nodes in the impedance network to steer current from the transconductance device through different impedances of the network to control the amount of current provided to the output terminal, and therefore the gain of the circuit. The impedances of the impedance network are coupled electrically in series so that the network maintains a constant impedance at the output terminal irrespective of which node the current is steered to in the impedance network.

As compared to the prior art circuit of FIG. 1, the noise figure of the circuit according to the invention is degraded to a much lesser extent from one gain mode to another, since the signal current is not dumped directly to the power supply and does not alter the output impedance.

According to one aspect of the invention, the impedance network includes a plurality of discrete devices, such as resistors, capacitors, coils, and diodes. The impedance network may include a mixture of difference devices.

According to another aspect of the invention, the gain-control circuit includes a plurality of current switches each selectively coupling a respective node of the impedance network to the main current path of the transconductance device.

According to yet another aspect of the invention, a VGA is disclosed having an impedance-matching output circuit coupled between the impedance network and the output terminal.

The invention also concerns a method of controlling current supplied to an output terminal from a transconductance stage.

These and other object, features and advantages of the invention will become apparent with reference to the following detailed description and the drawings.

DESCRIPTION OF THE PREFERRED EMBODIMENTS

Figure 2:
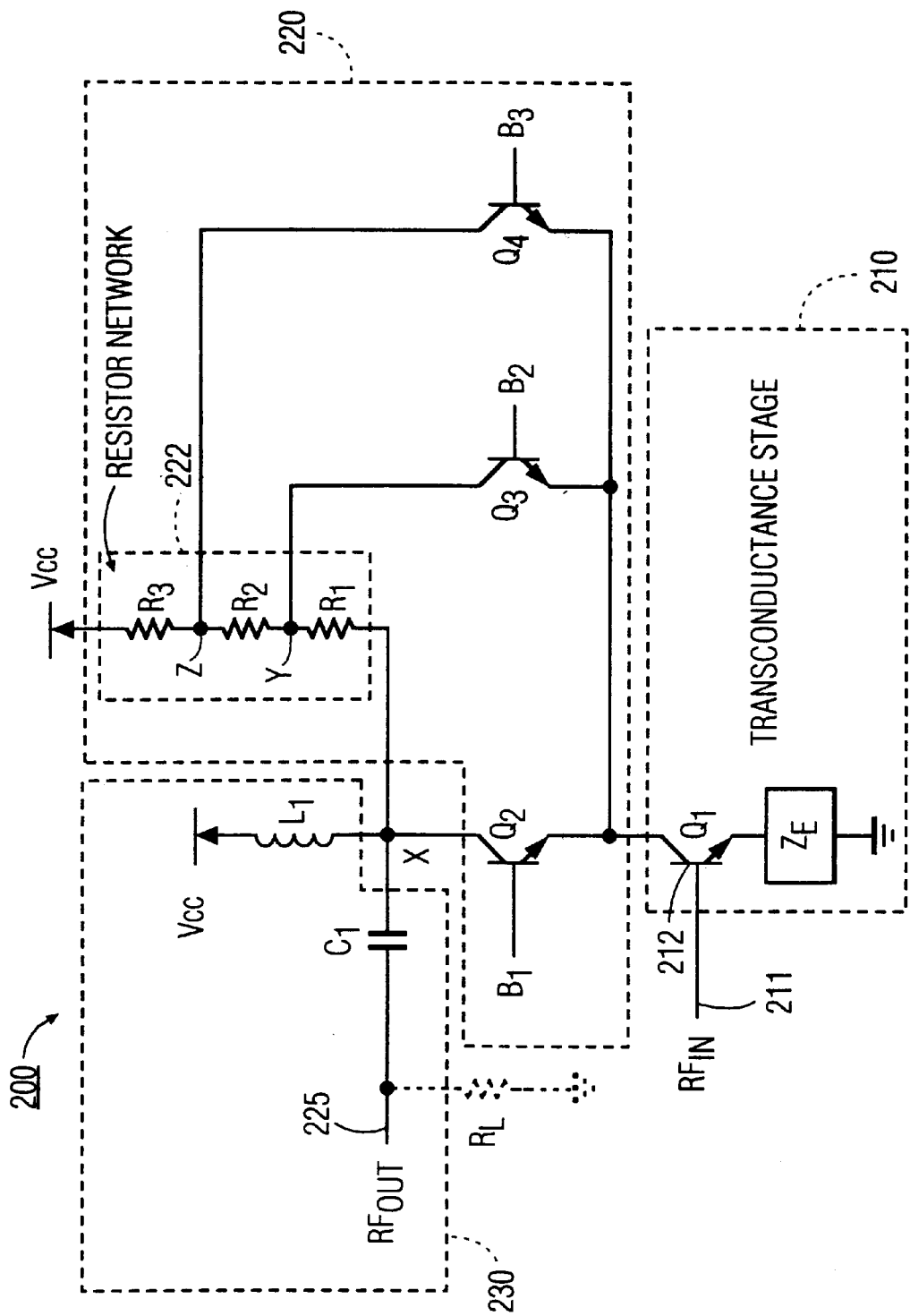
FIG. 2 is a circuit diagram of a VGA according to the invention.

FIG. 2 is a circuit diagram of a discrete gain-control VGA circuit 200 according to the invention with a current steering mechanism that avoids significant changes in the NF from one gain mode to another. The VGA 200 includes a transconductance stage 210, a gain-control circuit 220 and an output circuit 230. Stage 210 includes a transconductance device, transistor Q1, having a control electrode 212 coupled to input terminal 211 which receives a radio frequency input signal $RF_{in}$, and a main current path which extends between first and second conducting electrodes 213, 214. In this embodiment, the transistor Q1 is a bipolar transistor in which the collector and emitter respectively form the first and second conducting electrodes and the base forms the control terminal. A degeneration impedance Ze is optionally coupled between the emitter of the transistor Q1 and a supply terminal, in this case ground. The transconductance device serves to convert the RF input signal into a signal current.

The gain-control circuit 220 includes an impedance network 222 formed by the resistors R1, R2, and R3 which are connected in series between a supply terminal Vcc and a node X. The current steering circuit further includes three current steering switches formed by the transistors Q2, Q3 and Q4. The transistor Q2 has a main current path which in its conducting state couples the node x to the collector of the transistor Q1. Similarly, the transistors Q3 and Q4 have main current paths coupling the collector of the transistor Q1 to the nodes Y and Z of the impedance network 222. Each of the transistors Q2, Q3, Q4 have control electrodes respectively connected to control nodes B1, B2, and B3 which receive control signals to control the state of the main current paths of the switches Q2, Q3, Q4 between a conductive and a non-conductive state.

The output circuit 230 includes an output terminal 225, and an impedance transformation network, formed by an inductor L1 and a capacitor C1, to match the impedance of the network 222 to that of an external load coupled to the output terminal, which external load is illustrated in FIG. 2 as resistor $R_L$ (in dashed lines).

The VGA of FIG. 2 has three gain modes: a low-gain mode, a medium-gain mode, and a high-gain mode. In the high-gain mode, the voltage at control node B1 is set to an appropriate bias voltage to render the transistor Q2 conductive while the voltages at the control nodes B2 and B3 are set low to render the transistors Q3 and Q4 non-conductive. The transistor Q2 functions as cascode transistor of the transconductance stage 210. The gain of the VGA 210 is the highest in this mode because the output current from the transconductance stage 210 is injected to the node (node X) which has the highest possible resistance (the sum of the resistances of the resistors R1, R2 and R3) of the resistor network 222.

The medium-gain mode is achieved by setting the bias voltages at nodes B1 and B3 low to turn off the transistors Q2 and Q4, respectively, whereas the voltage at node B2 is set to an appropriate bias voltage to turn the transistor Q3 on, i.e., render its main current path conductive. The transistor Q3 then functions as the cascode transistor of the transconductance stage 210, and the output current from stage 210 is injected into node Y. The gain reduction in this mode (compared to the high-gain mode) is proportional to the ratio of (R2+R3)/(R1+R2+R3). This ratio assumes that the output impedance of the VGA is perfectly matched to that of the external load.

In the low-gain mode, the voltage at nodes B1 and B2 are set low to turn off transistor Q2 and Q3, respectively, whereas the voltage at node B3 is set high to turn on the transistor Q4. The output current of the transconductance stage is then injected into node Z. The gain reduction in this mode (compared to the high-gain mode) is proportional to the ratio of (R3/(R1+R2+R3). If the ratio of the resistors R1:R2:R3 is 2:1:1, the gain step between each successive gain mode is a factor of two, i.e. 6 dB.

This gain-control technique can be expanded to include any number of gain modes. The number of gain modes can be reduced to two by removing the resistor R3 and the transistor Q4. Similarly, the number of gain modes can be increased to more than three by adding cascode transistors to the collector of the transconductance transistor Q1 and corresponding resistors to the resistor network 222. The gain steps can be set arbitrarily by choosing the appropriate resistor values.

The output impedance of the LNA is independent of the gain modes (or where current is injected into the resistor network) because the output impedance is only dependent on the impedance at node X. Using this gain-control technique, the noise figure of the circuit is only degraded by a small amount in the low-gain modes since no signal current is thrown away as in the current-steering scheme of the circuit of FIG. 1.

Figure 1:
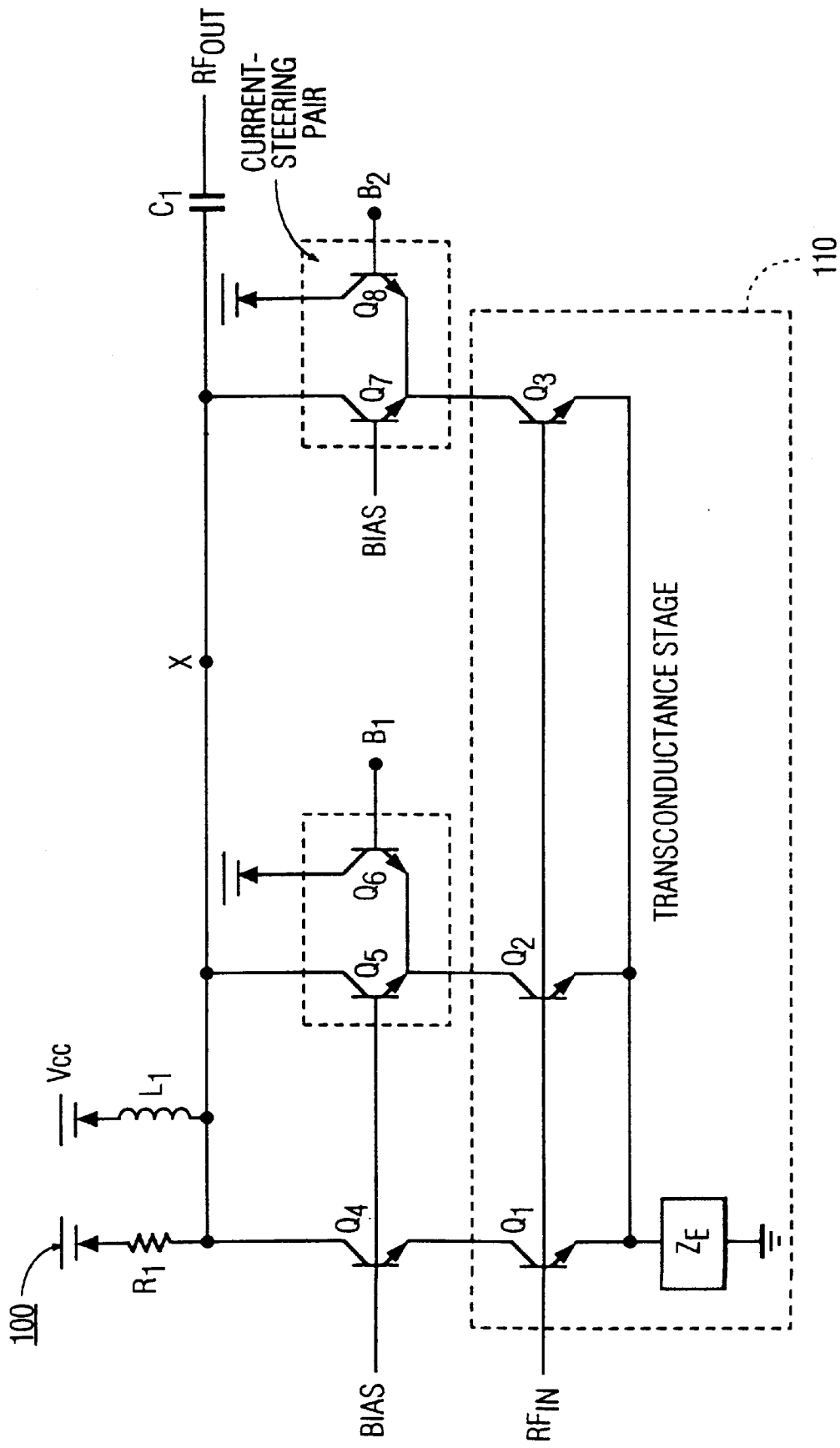
FIG. 1 is a circuit diagram of a prior art VGA.

The following Table lists the NF figures in the three different gain modes for the circuit according to the invention as embodied by the circuit of FIG. 2 in comparison to the prior art circuit of FIG. 1.

| GAIN (db) | Current Steering (FIG. 1) (NF) (db) | Impedance Network (FIG. 2) (NF) (db) |
| --- | --- | --- |
| 15 | 1.5 | 1.5 |
| 9 | 6.5 | 1.9 |
| 3 | 10.5 | 2.5 |

Note that the NF for the prior art circuit varies between 1.5 and 10.5, while that for the circuit according to the invention has a significantly smaller increase in the NF over the same range of gains.

Figure 3D:
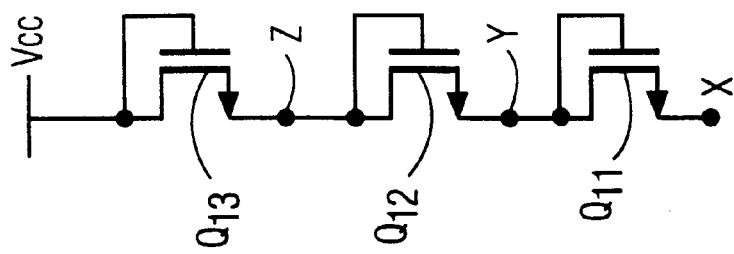
FIGS. 3(*a*)–(*d*) illustrate various alternative embodiments of an impedance network for the VGA of FIG. 2.
Figure 3C:
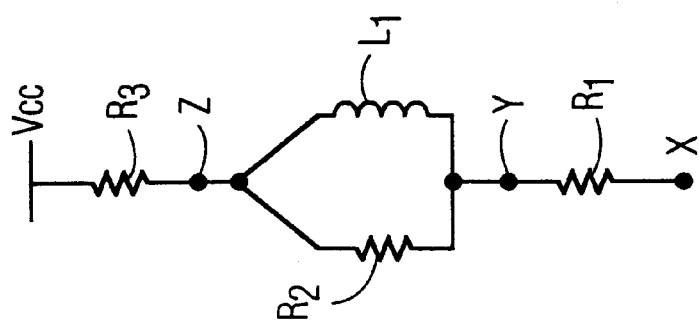
Figure 3B:
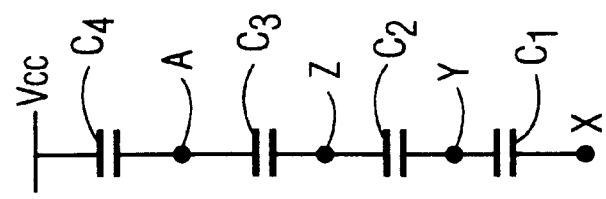
Figure 3A:
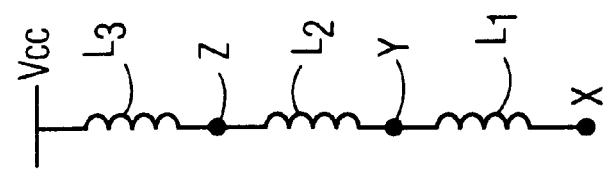

The impedance network can have other configurations than that shown in FIG. 2, so long as the network provides a series string of impedances into which current from the transconductance stage can be injected at various points, or nodes, without changing the impedance at the output. For example, instead of having three discrete resistors, a single resistor with contacts along its length defining current injection nodes would be suitable. FIG. 3 shows various other possible configurations for the impedance network 222, which is intended to be illustrative only and not limiting. In FIG. 3(a), the network includes three inductors L1–L3 while in FIG. 3(b) the network includes four capacitors C1–C4. Since there are four devices in FIG. 3(b), an additional current steering switch would typically be added to the gain control circuit to take advantage of the additional node A. In FIG. 3(c), an inductor L1 is in parallel with a resistor R2. Note that the parallel devices L1, R2 together define an impedance between the successive nodes Y and Z. In FIG. 3(d), the impedance network includes three diode-connected MOSFETS Q11, Q12, Q13.

While the current switches Q2–Q4 are shown as steering the entire current from the transconductance stage, it is also feasible to switch portions of this current, for example to steer half of the current through node X and the other half of the current through node Y.

Finally, while the transconductance device and the current steering switches are illustrated as bipolar transistors, other suitable devices may be used as well, such as MOSFETs.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

I claim:

1. A circuit for a narrow band RF receiver, comprising:
a transconductance device having a main current path and a control electrode which receives an RF input signal to control a current through said main current path;
an output terminal coupled to said main current path, the output terminal for coupling to a load having a load impedance;
a gain-control circuit (i) having an impedance network with a plurality of serially coupled impedances coupled to said output terminal to maintain a constant impedance at said output terminal and (ii) which selectively steers current from said main current path of said transconductance device through different impedances of said network to vary the current supplied to said output terminal from said main current path of said transconductance device; and
an impedance matching network coupled between said output terminal and said impedance network and matching the impedance of the impedance network to the load impedance.

2. A circuit according to claim 1, wherein said impedance network includes a plurality of nodes each defining a different impedance along said impedance network.

3. A circuit according to claim 2, wherein said gain-control circuit includes a plurality of switches each selectively coupling a respective said node to said main current path of said transconductance device.

4. A circuit according to claim 1, wherein said impedance network includes a plurality of discrete devices coupled electrically in series.

5. A circuit according to claim 4, wherein said discrete devices include at least one device selected from the group consisting of: a resistor, a capacitor, an inductor, and a diode.

6. A circuit according to claim 4, wherein said impedance network includes a plurality of devices coupled in parallel between two successive nodes of the impedance network and together defining a discrete impedance of the impedance network.

7. A circuit according to claim 4, wherein said gain-control circuit comprises a plurality of switches each selectively coupling a respective said device to said main current path of said transconductance device.

8. A circuit according to claim 1, further including a degeneration impedance coupled to said main current path of said transconductance device.

9. A circuit according to claim 1, further including an output matching impedance coupled between said output terminal and said impedance matching network.

10. A circuit according to claim 1, wherein said transconductance device is a bipolar transistor having a collector and an emitter between which extends said main current path, and a base comprising said control electrode.

11. A circuit according to claim 1, wherein said gain-control circuit includes a plurality of switches each selectively coupling a respective said impedance to said main current path of said transconductance transistor.

12. A single-ended, variable-gain amplifier, comprising:
a first supply and a second supply having a lower potential than said first supply;
an input terminal for receiving an RF input signal;
an output terminal for coupling to a load having a load impedance;
a transconductance stage including a first transistor having (i) a control electrode coupled to said input terminal and (ii) a main current path extending between first and second conducting electrodes, said second conducting electrode being coupled to said second supply;
a discrete-gain control circuit including (i) an impedance network having a plurality of impedances coupled electrically in series between said output terminal and said first supply, said impedance network having a total impedance and a first node defining a first impedance less than said total impedance, and (ii) a switch operable to selectively couple the first conducting electrode of said first transistor to said first node to shunt current from said main current path through said first impedance and
an impedance matching network coupled between said output terminal and said impedance network and matching the total impedance of the impedance network to the load impedance.

13. A variable-gain amplifier according to claim 12, wherein said impedance network comprises a plurality of nodes defining a respective impedance of said network, and said gain-control circuit includes a plurality of switches each to selectively couple a respective node to said first conducting electrode of said first transistor.

14. A variable-gain amplifier according to claim 12, wherein said impedance network includes a plurality of discrete devices.

15. A variable-gain amplifier to claim 14, wherein said gain-control circuit includes a plurality of switches each selectively coupling a respective said device to said first conducting electrode of said first transistor.

16. A variable-gain amplifier according to claim 12, wherein said first transistor is a bipolar transistor, said control electrode being the base of said bipolar transistor, and said first and second conducting electrodes being the collector and emitter, respectively, of said bipolar transistor.

17. A variable-gain amplifier according to claim 12, further comprising a degeneration impedance coupled between the second supply and second conducting electrode.

18. A variable-gain amplifier according to claim 12, further comprising an output-matching impedance coupled between said impedance network and said output terminal.

19. A method of controlling the gain of a circuit in a narrow band RF device including a transconductance device which converts an input RF signal to a signal current and an output terminal coupled to receive the signal current from said transconductance device, the output terminal being coupled to a load having a load impedance, comprising the steps of:
fixing the impedance of the output terminal by coupling an impedance network to the output terminal, the impedance network having a plurality of impedances coupled electrically in series;
selectively steering the signal current from the transconductance device through different ones of the impedances of the impedance network to control the current at said output terminal; and
matching the impedance network to the load impedance.

20. A variable gain circuit, comprising:

transconductance means for converting an input RF signal to a signal current;

an output terminal coupled to said transconductance means, said output terminal being coupled to a load having a load impedance;

impedance means coupled to said output terminal to maintain a stable impedance at said output terminal, said impedance defining a total impedance;

current steering means for selectively steering at least a portion of the signal current from said transconductance means and injecting said signal current portion into said impedance means at a node defining an impedance less than said total impedance to vary the signal current supplied to said output terminal from said transconductance means; and an impedance matching network coupled between said output terminal and said impedance network and matching the total impedance of the impedance means to the load impedance.

* * * * *